United States Patent [19]

Bayati, Abutorab

[11] 4,354,158
[45] Oct. 12, 1982

[54] CIRCUIT ARRANGEMENT FOR GENERATING A SAMPLING PULSE TRAIN FOR A PERIODIC SIGNAL

[75] Inventor: Bayati, Abutorab, Karlsruhe, Fed. Rep. of Germany

[73] Assignee: Siemens Aktiengesellschaft, Berlin and Munich, Fed. Rep. of Germany

[21] Appl. No.: 76,383

[22] Filed: Sep. 17, 1979

[30] Foreign Application Priority Data

Sep. 14, 1978 [DE] Fed. Rep. of Germany ....... 2840065

[51] Int. Cl.³ .......................................... H03K 3/64
[52] U.S. Cl. .......................................... 328/75; 328/61
[58] Field of Search ..................... 328/48, 59, 134, 72, 328/75, 61

[56] References Cited

U.S. PATENT DOCUMENTS

| | | | |
|---|---|---|---|
| 3,263,174 | 7/1966 | Bjorkman et al. | 328/48 |
| 3,500,214 | 3/1970 | Broadhead et al. | 328/48 |
| 3,678,398 | 7/1972 | Thomenius | 328/48 |
| 3,723,889 | 3/1973 | Oberst | 328/134 |
| 4,123,704 | 10/1978 | Johnson | 328/134 |
| 4,131,856 | 12/1978 | Chapman | 328/72 |

*Primary Examiner*—Eli Lieberman
*Attorney, Agent, or Firm*—Kenyon & Kenyon

[57] ABSTRACT

Circuit arrangement for generating a sampling pulse train for a periodic signal, wherein a clock pulse generator has its output connected to the inputs of two pre-settable backward counters, the first of which is pre-set with the number of the sampling points and the second of which, furnishing at its output the sampling pulse train, is set with the number of output pulses of the first backward counter, which have accumulated in a forward counter during a period of the signal, the bit outputs of the forward counter being connected to the bit inputs of an intermediate storage device, and bit outputs of the intermediate storage device being connected to the setting inputs of the second backward counter.

3 Claims, 2 Drawing Figures

CIRCUIT ARRANGEMENT FOR GENERATING A SAMPLING PULSE TRAIN FOR A PERIODIC SIGNAL

BACKGROUND OF THE INVENTION

This invention relates to a circuit arrangement for generating a sampling pulse train for a periodic signal.

A need for such circuit arrangements exists, for instance, in test devices, where a test sample delivers a periodic signal which is compared with a stored reference signal, the deviation between the two being displayed and processed.

It is a basic prerequisite for comparing the two signals that the stored signal must be read out synchronously with the periodic signal. For this purpose, sampling pulses are needed to select the addresses of the stored signals and at the same time, to sample the periodic signal. The frequency of the sampling pulse train used for this purpose must be a multiple of the frequency of the periodic signal.

SUMMARY OF THE INVENTION

It is an object of the present invention to provide a circuit arrangement for generating a sampling pulse train for a periodic signal using digital switching units. According to the present invention, this problem is solved by connecting the output of a clock pulse generator to the inputs of two frequency reducers, the first of which has a step-down ratio equal the number of the sampling points uniformly distributed over the period of the signal, and the second of which furnishes the sampling pulse train at its output and has a step-down ratio equal to the number of the output pulses of the first reducer, which has accumulated in a counter during a period of the signal.

Advantageously, the frequency reducers are pre-settable backward counters.

In one embodiment of the present invention, bit outputs of the counter are connected to bit inputs of an intermediate storage device and bit outputs of the intermediate storage device to setting inputs of the second frequency reducer. In this embodiment, a reset input of the counter and a carry control input of the intermediate storage device are addressed by the output signal of a trigger circuit driven by the periodic signal.

DETAILED DESCRIPTION OF THE INVENTION

Figure 1:
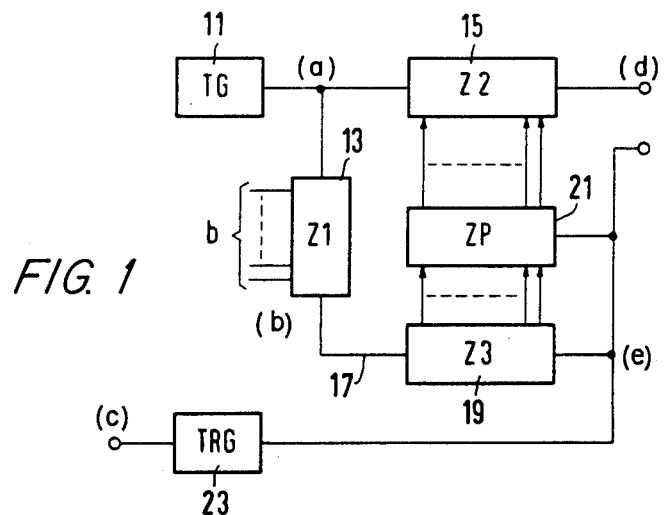
FIG. 1 is a block diagram of the circuit arrangement of the present invention.

Referring to FIG. 1, the output of a clock pulse generator 11 is connected to the counting inputs of a first backward counter 13 and a second backward counter 15. The backward counter 13 can be preset with a number b, which corresponds to the number of addresses of the stored reference value signal and to the number of the sampling points distributed over the period of the periodic signal. A carry output 17 of the backward counter 13 is connected to the counting input of a forward counter 19. Bit outputs of the counter 19 are connected to bit inputs of an intermediate storage device 21. Bit outputs of the intermediate storage device 21 are connected to setting inputs of the second backward counter 15, i.e., the backward counter 15 can be preset with the number stored in the intermediate storage device 21. The periodic signal to be sampled is fed to the input of a trigger circuit 23. The output of the trigger circuit 23, at which a trigger signal is present, is connected to a reset input of the forward counter 19. Similarly, a carry control input of the intermediate storage device 21 is connected to the output of the trigger circuit 23. The trigger signal is also fed to an output terminal.

The backward counter 13 is programmed with the number b of the stored signal values. If the frequency of the clock pulse train taken from the clock pulse generator 11 if f, then a sequence frequency of f/b is obtained for the carry or overflow pulses of the backward counter 13. These overflow pulses are counted by the forward counter 19, during the period T which is determined by the trigger circuit 23. The position of the trigger pulse from the trigger circuit 23 can be varied continuously within a period of the periodic signal. The content of the counter 19 for each period, controlled by the trigger pulse, is transferred to the intermediate storage device 21. Thereupon, the counter 19 is cleared. Via the intermediate storage device 21, the backward counter 15 is preset with a number which is directly proportional to the signal period. This number is T (f/b). Accordingly, the frequency of the sampling pulse train which is present at the output of the second backward counter 15 is $f/[T(f/b)] = b \cdot F$, where F is the fundamental frequency of the periodic signal. The sequence frequency f of the clock pulses should be substantially larger than $b \cdot F$. For instance, if the desired accuracy is $\geq 1\%$, f must be $\geq 100 \, b \cdot F$.

Figure 2:
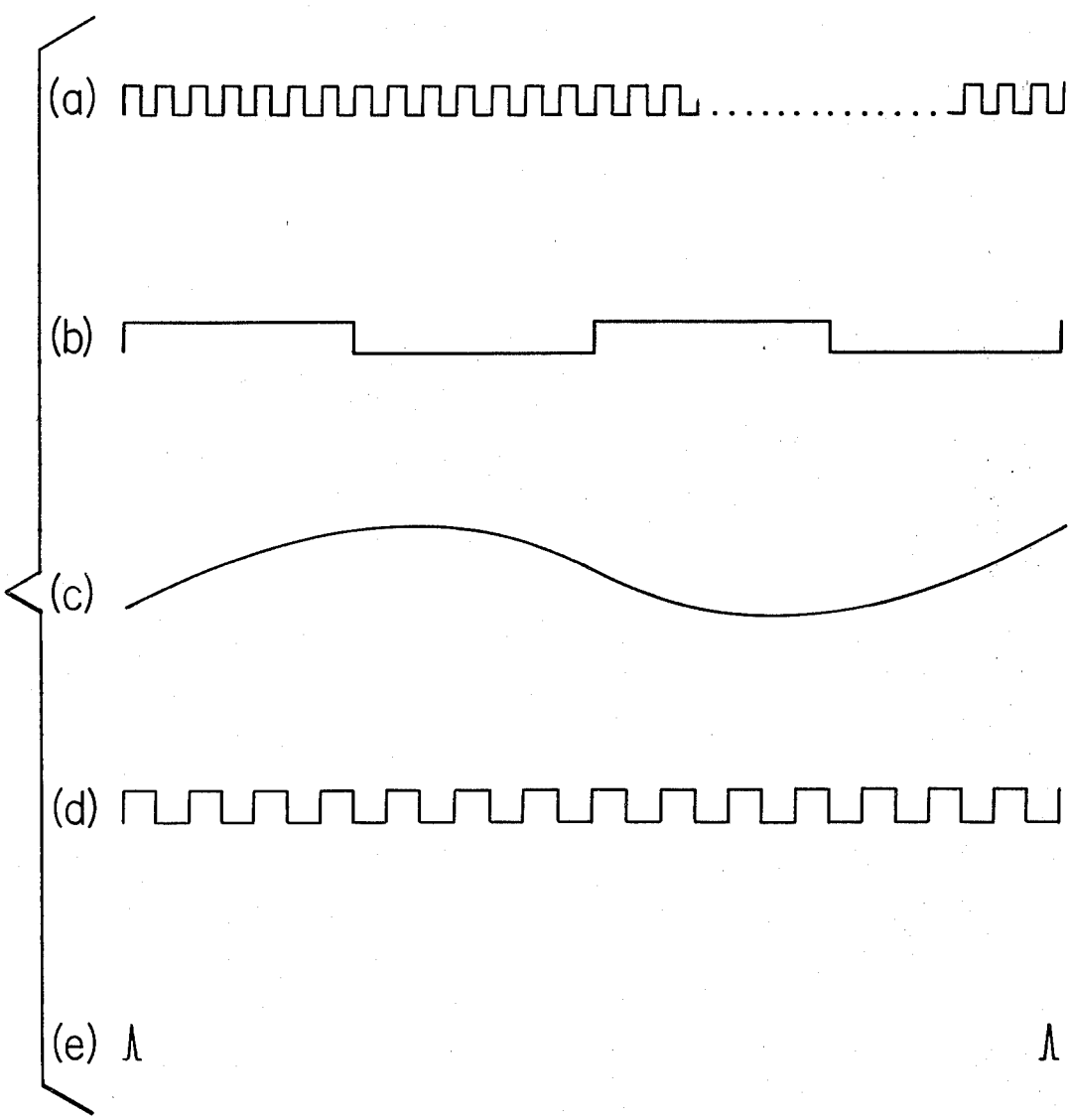
FIG. 2 is a timing diagram of the signals at various points in the block diagram of FIG. 1.

FIG. 2 is a timing diagram of the signals present at the corresponding points in the block diagram of FIG. 1. Signal (a) in FIG. 2 represents the clock pulses with frequency f present at the counting inputs to counters 13 and 15. The output of counter 13 is signal (b), where the number b at the preset inputs to counter 13 is 16, corresponding to 16 sampling points distributed over the period of the periodic signal (c). Thus, present on line 17 is a signal with frequency $f/b = f/16$ as shown by signal (b) in FIG. 2. Signal (c) represents the periodic signal with frequency F for which a sampling pulse train will be generated. Signal (e) is the output of the trigger circuit 23. Signal (d) is the sampling pulse train present at the output of counter 15 with a frequency equal to $b \cdot F = 16F$.

After the stored curve is read out synchronously, a comparison with the periodic signal can be made. By adjusting the triggering, a shift of the stored signal in time can be achieved.

What is claimed is:

1. A circuit arrangement for generating a sampling pulse sequence for a periodic signal comprising:
   (a) a clock pulse generator;
   (b) a first presettable backward counter which acts as a first frequency reducer, having the output of said clock pulse generator as an input, said first presettable backward counter having a step down ratio equal to a number of sampling points uniformly distributed over the period T of the signal and providing carry output pulses.
   (c) a second presettable backward counter which acts as a second frequency reducer, having the output of said clock generator as an input and furnishing the sampling pulse sequence at its output;

(d) a forward counter having the carry output pulses of said first presettable backward counter as inputs;

(e) an intermediate storage device, bit outputs of said forward counter being connected to the bit inputs of said intermediate storage device and bit outputs of the intermediate storage device connected to setting inputs of said second presettable backward counter so as to set the step down ratio of said second presettable backward counter; and (f) means to provide a reset input to said forward counter and a carry control input to said intermediate storage device for each period T of the signal.

2. A circuit arrangement according to claim 1, wherein said means for providing a reset input and carry control input comprise a trigger circuit, acted upon by said periodic signal, providing its output as said reset input and carry control input.

3. A circuit arrangement according to claim 2, wherein the output of the trigger circuit can be shifted over the period T of the periodic signal.

* * * * *